United States Patent
Fang et al.

(10) Patent No.: US 8,349,202 B2
(45) Date of Patent: Jan. 8, 2013

(54) METHODS FOR CONTROLLING BEVEL EDGE ETCHING IN A PLASMA CHAMBER

(75) Inventors: Tong Fang, Fremont, CA (US); Yunsang Kim, Monte Sereno, CA (US); Andrew D. Bailey, III, Pleasanton, CA (US); Olivier Rigoutat, Bethel, CT (US); George Stojakovic, Wappingers Falls, NY (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/300,483

(22) Filed: Nov. 18, 2011

(65) Prior Publication Data
US 2012/0074099 A1    Mar. 29, 2012

Related U.S. Application Data

(60) Division of application No. 12/021,177, filed on Jan. 28, 2008, now Pat. No. 8,083,890, which is a continuation-in-part of application No. 11/440,561, filed on May 24, 2006, now Pat. No. 7,909,960, which is a continuation-in-part of application No. 11/237,327, filed on Sep. 27, 2005, now abandoned.

(51) Int. Cl.
*C23F 1/00* (2006.01)

(52) U.S. Cl. .......................... 216/67; 438/714

(58) Field of Classification Search .................. None
See application file for complete search history.

(56) References Cited

U.S. PATENT DOCUMENTS

| | | | | |
|---|---|---|---|---|
| 2005/0173067 A1* | 8/2005 | Lim | ..................... | 156/345.32 |
| 2006/0086461 A1* | 4/2006 | Inada et al. | .............. | 156/345.33 |
| 2007/0068623 A1* | 3/2007 | Kim et al. | .................. | 156/345.3 |
| 2007/0068900 A1* | 3/2007 | Kim et al. | ........................ | 216/67 |
| 2008/0182412 A1* | 7/2008 | Bailey, III et al. | ............ | 438/689 |
| 2009/0170334 A1* | 7/2009 | Fang et al. | .................... | 438/710 |

FOREIGN PATENT DOCUMENTS

JP    2006120875 (A)    5/2006

* cited by examiner

*Primary Examiner* — Allan Olsen
(74) *Attorney, Agent, or Firm* — Martine Penilla Group, LLP (57) ABSTRACT

Methods for bevel edge etching are provided. One example method is for etching a film on a bevel edge of a substrate in a plasma etching chamber. The method includes providing the substrate on a substrate support in the plasma etching chamber. The plasma etching chamber has a top edge electrode and a bottom edge electrode disposed to surround the substrate support. Then flowing an etching process gas through a plurality of edge gas feeds disposed along a periphery of the gas delivery plate. The periphery of the gas deliver plate is oriented above the substrate support and the bevel edge of the substrate, and the flowing is further directed to a space between the top edge electrode and bottom edge electrode. And, flowing a tuning gas through a center gas feed of the gas delivery plate.

12 Claims, 9 Drawing Sheets

METHODS FOR CONTROLLING BEVEL EDGE ETCHING IN A PLASMA CHAMBER

CLAIM OF PRIORITY

This is a divisional application of U.S. patent application Ser. No. 12/021,177, filed on Jan. 28, 2008 now U.S. Pat. No. 8,083,890, entitled "Gas Modulation to Control Edge Exclusion in a Bevel Edge Etching Plasma Chamber," which was continuation-in-part of application Ser. No. 11/440,561, filed May 24, 2006, now U.S. Pat. No. 7,909,960, and which claimed priority under 35 USC 120 as a continuation-in-part of application Ser. No. 11/237,327, filed on Sep. 27, 2005 now abandoned, each of which is herein incorporated by reference.

CROSS REFERENCE TO RELATED APPLICATIONS

This application is related to U.S. patent application Ser. No. 11/758,576, filed on Jun. 5, 2007, entitled "Edge Electrodes with Variable Power," U.S. patent application Ser. No. 11/758,584, filed on Jun. 5, 2007, entitled "Edge Electrodes with Dielectric Covers," U.S. patent application Ser. No. 11/440,561, filed on May 24, 2006, entitled "Apparatus and Methods to Remove Films on Bevel Edge and Backside of Wafer," U.S. patent application Ser. No. 11/355,458, filed on Feb. 15, 2006, entitled "Plasma Processing Reactor with Multiple Capacitive and Inductive Power Sources," and U.S. patent application Ser. No. 11/363,703, filed on Feb. 27, 2006, entitled "Integrated Capacitive and Inductive Power Sources for a Plasma Etching Chamber." The disclosure of each of the above-identified related applications is incorporated herein by reference.

FIELD OF INVENTION

The present invention relates in general to substrate manufacturing technologies and in particular to apparatus and methods for the removal of deposited films and/or etch byproducts from a bevel edge of a substrate.

BACKGROUND

In the processing of a substrate, e.g., a semiconductor substrate (or wafer) or a glass panel such as one used in flat panel display manufacturing, plasma is often employed. During substrate processing, the substrate (or wafer) is divided into a plurality of dies, or rectangular areas. Each of the plurality of dies will become an integrated circuit. The substrate is then processed in a series of steps in which materials are selectively removed (or etched) and deposited.

Typically, a substrate is coated with a thin film of hardened emulsion (such as a photoresist mask) prior to etching. Areas of the hardened emulsion are then selectively removed, causing parts of the underlying layer to become exposed. The substrate is then placed on a substrate support structure in a plasma processing chamber. An appropriate set of plasma gases is then introduced into the chamber and a plasma is generated to etch exposed areas of the substrate.

During an etch process, etch byproducts, for example polymers composed of Carbon (C), Oxygen (O), Nitrogen (N), Fluorine (F), etc., are often formed on the top and the bottom surfaces near a substrate edge (or bevel edge). Etch plasma density is normally lower near the edge of the substrate, which results in accumulation of polymer byproducts on the top and on the bottom surfaces of the substrate bevel edge.

Typically, there are no dies present near the edge of the substrate, for example between about 2 mm to about 15 mm from the substrate edge. However, as successive purposely deposited films and byproduct polymer layers are deposited on the top and bottom surfaces of the bevel edge as a result of several different deposition and etch processes, bonds that are normally strong and adhesive will eventually weaken during subsequent processing steps. The purposely deposited films and polymer layers formed near the bevel edge would then peel or flake off, often onto another substrate during substrate transport. For example, substrates are commonly moved in sets between plasma processing systems via substantially clean containers, often called cassettes. As a higher positioned substrate is repositioned in the container, particles (or flakes) of purposely deposited film and byproducts on the bevel edge may fall on a lower substrate where dies are present, potentially affecting device yield.

Dielectric films, such as SiN and $SiO_2$, and metal films, such as Al and Cu, are examples of films that are purposely deposited on the substrates. These films can also be deposited on the bevel edge (including the top and bottom surfaces) and do not get removed during etching processes. Similar to etching byproducts, these films at bevel edge can accumulate and flake off during subsequent processing steps, thereby impacting device yield.

For advanced technologies, it is desirable to expand the usable areas on the substrate surface to the edge of wafer (or substrate). As mentioned above, there are typically no dies present near the edge of the substrate, for example between about 2 mm to about 15 mm from the substrate edge, which is also called the "edge exclusion zone." Edge exclusion zone is a region, such as between about 2 mm to about 15 mm from the substrate edge, at the edge of the substrate that is not usable and does not have dies. For advanced technologies, the target is to have usable area expended to less than about 2 mm from the edge of the substrate to increase usable area on the substrate. Therefore, the edge exclusion zone is targeted to be less than 2 mm.

In view of the foregoing, there is a need for apparatus and methods that remove unwanted deposits on the bevel edge of substrates to reduce edge exclusion zone to be less than 2 mm from the edge of substrates. Such apparatus and methods would expand usable area and improve process yield on the substrate.

SUMMARY

The various embodiments provide apparatus and methods of removal of unwanted deposits near the bevel edge of substrates to improve process yield. The embodiments provide apparatus and methods with center and edge gas feeds as additional process knobs for selecting a most suitable bevel edge etching processes to push the edge exclusion zone further outward towards the edge of substrates. Further the embodiments provide apparatus and methods with tuning gas(es) to change the etching profile at the bevel edge and using a combination of center and edge gas feeds to flow process and tuning gases into the chamber. Both the usage of tuning gas and location of gas feed(s) affect the etching characteristics at bevel edge. Total gas flow, gap distance between the gas delivery plate and substrate surface, pressure, and types of process gas(es) are also found to affect bevel edge etching profiles.

It should be appreciated that the present invention can be implemented in numerous ways, including as a process, an apparatus, or a system. Several inventive embodiments of the present invention are described below.

In one embodiment, one example method is for etching a film on a bevel edge of a substrate in a plasma etching chamber. This method includes providing the substrate on a substrate support in the plasma etching chamber. The plasma etching chamber has a top edge electrode and a bottom edge electrode disposed to surround the substrate support. The method positions a gas delivery plate in the plasma processing chamber at a distance of less than about 0.6 mm from the substrate support. The flowing an etching process gas through a plurality of edge gas feeds disposed along a periphery of the gas delivery plate. The periphery of the gas deliver plate is oriented above the substrate support and the bevel edge of the substrate, and the flowing is further directed to a space between the top edge electrode and bottom edge electrode. And, flowing a tuning gas through a center gas feed of the gas delivery plate. The tuning gas is directed over a center region of the substrate so as to flow way from the center region and toward the bevel edge of the substrate and mix with the etching process gas. The method also includes applying RF power to one of the top or bottom edge electrodes, wherein the applied power acts to strike a plasma to etch the film of the bevel edge of the substrate.

In another embodiment, a method of etching a thin film on a bevel edge of a substrate in a plasma etching chamber is provided. The method includes placing the substrate on a substrate support in the plasma etching chamber. The method also includes flowing an etching process gas through a center gas feed located or an edge gas feed. The center gas feed and the edge gas feed are disposed above the substrate support. The method further includes flowing a tuning process gas through the center gas feed located or the edge gas feed. The tuning gas is used to change the etching plasma characteristics at the bevel edge.

In addition, the method includes generating an etching plasma near the bevel edge of the substrate to etch the thin film on the bevel edge by powering a bottom edge electrode or a top edge electrode with a RF power source and grounding the edge electrode that is not powered by the RF power source. The bottom edge electrode surrounds the substrate support and the top edge electrode surrounds the gas distribution plate, wherein the distance between the top edge electrode and the bottom edge electrode is less than about 1.5 cm to confine the treatment plasma. Additionally, the method includes etching the thin film by the generated etching plasma.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Several exemplary embodiments for improved mechanisms to remove undesirable deposits on the bevel edges of wafers to improve process yield are provided. It will be apparent to those skilled in the art that the present invention may be practiced without some or all of the specific details set forth herein.

Figure 1A:
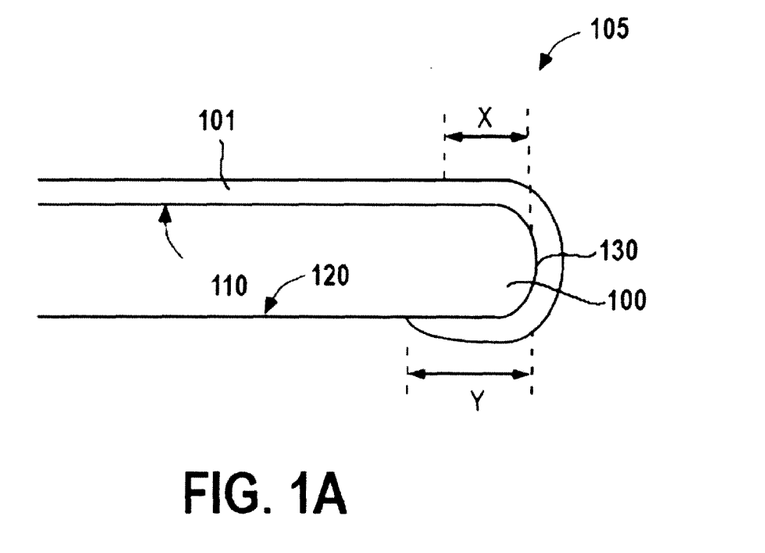
FIG. 1A shows a cross-sectional view of a thin film near a bevel etch, in accordance with one embodiment of the present invention

FIG. 1A shows a cross-sectional view of a substrate 105 that has a substrate body 100 with a front side 110, a backside 120 and an edge 130 between the front and backsides, in accordance with one embodiment of the present invention. Substrate body 100 could be a wafer without other films and features. Substrate body 100 could also have various films and features from prior processing. In FIG. 1A, there is a thin film layer 101 covering the substrate front side 110 and substrate edge 130. The thin film layer 101 could be a dielectric layer, such as silicon dioxide (SiO2), or silicon nitride (SiN), a metal layer, such as tantalum (Ta), tantalum nitride (TaN), cupper (Cu), or Aluminum (Al). The thin film layer 101 can be a layer of photoresist or etching byproducts. Further, the thin film layer 101 could also be a dielectric layer or a metal layer mixed with photoresist and/or etching byproducts. The thickness of the thin film 101 can range from a few angstroms to a few microns.

The thin film layer 101 extends to a distance Y from the substrate edge 130 of the substrate 105. In one embodiment, the distance Y extends all the way to the center of backside surface 120 of substrate body 100. In another embodiment, the distance Y is between about 2 mm to about 15 mm from the edge 130. The thin film layer 101 on the bevel edge needs to be removed to prevent accumulation of thin film that results in possible flaking during future substrate handling and other substrate processing. As described above, for advanced technologies, the trend is to extend the usable area to the edge of substrate. Distance "X" is the distance from the edge 130 that thin film layer 101 should be removed. For advanced technologies, distance "X" is less than about 2 mm, preferable less than about 1 mm, and more preferably less than about 0.5 mm The surface area beyond distance X (towards the center of substrate) is considered usable area for constructing devices.

Figure 1B:
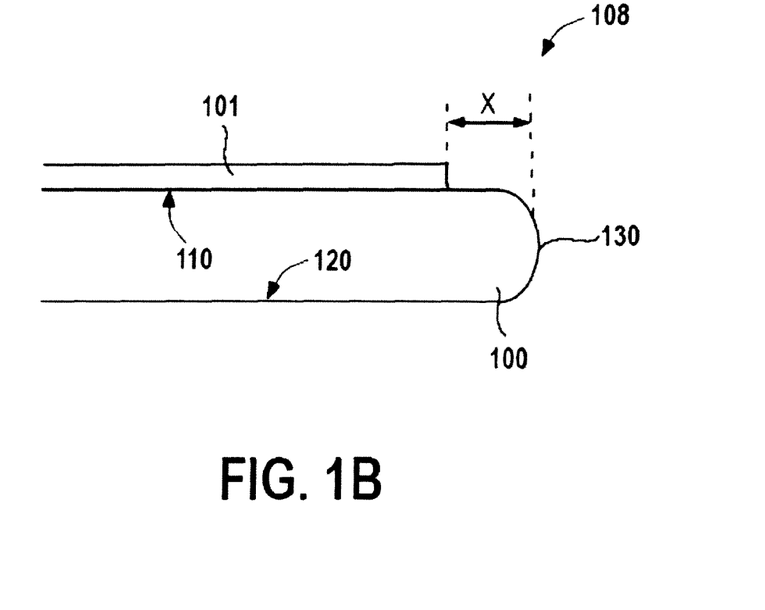
FIG. 1B shows a cross-sectional view of a thin film with the film on the bevel edge being removed, in accordance with one embodiment of the present invention.

FIG. 1B shows that after a bevel edge etching process, the film on the bevel edge is removed. The thin film layer 101 on the front side is removed to distance "X" from the edge 130. As mentioned above, the substrate surface 110 with thin film layer 101 not removed during substrate etching in FIG. 1B is considered usable area.

Figure 1C:
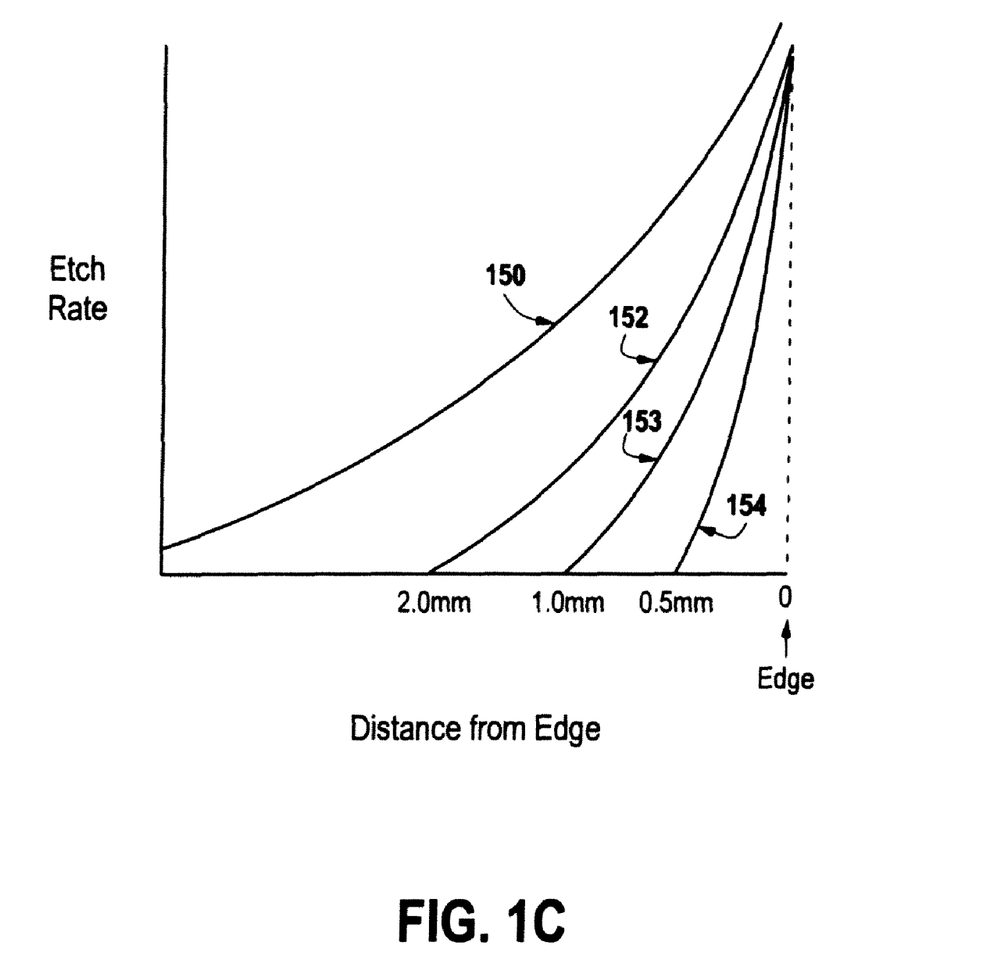
FIG. 1C shows four different bevel edge etching profiles, in accordance with one embodiment of the present invention.

FIG. 1C shows etch rates (ER) near the bevel edge for bevel edge plasma etching processes. Curves 150, 152, 154, and 156 show three different etch rate curves near bevel edge. Curve 150 shows results of a conventional process that produces broader bevel etch profile near substrate edge. The etch rate is non-zero at a distance greater than 2 mm from the edge, such as edge 130 of FIG. 1A. Curve 152 shows results of a process that produces a narrower bevel etch profile than curve 150. The etch rate on the substrate surface is zero until about 2 mm from the edge. Curves 154 and 156 are even narrower than curve 152. Etch rate is non-zero from edge to about 1 mm from substrate edge for curve 154 and to about 0.5 mm for curve 156. For process technologies that require edge exclusion less than about 2 mm, even to 1 mm or 0.5 mm, processes that can produce etch curves, such as curve 152, curve 154 and curve 156, can be used. For the purpose of reducing edge exclusion zone to less than about 2 mm from the edge of substrate, processes that produce curves 152, 154, and 156 are better than process that produces curve 150.

Figure 2:
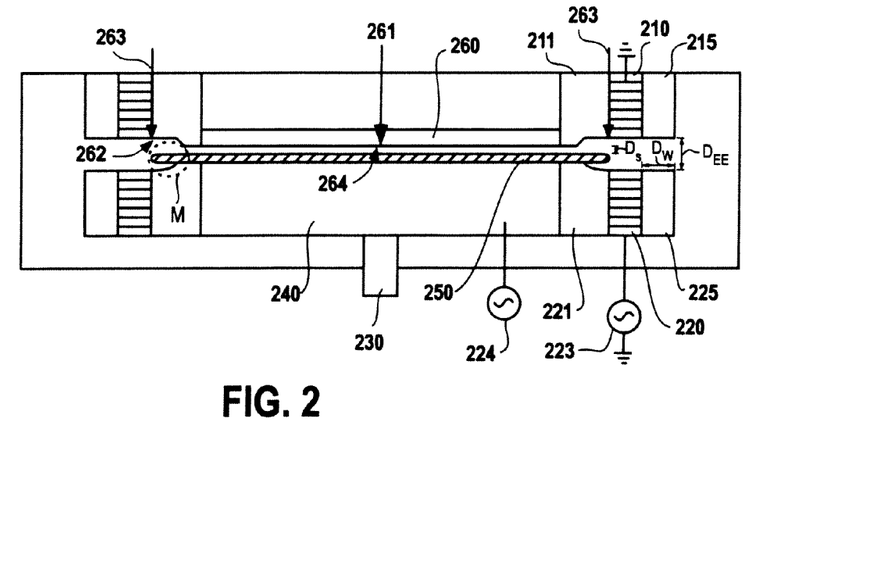
FIG. 2 shows a cross-sectional view of a plasma system configured to generate a bevel edge etching plasma, in accordance with one embodiment of the present invention.
Figure 2A:
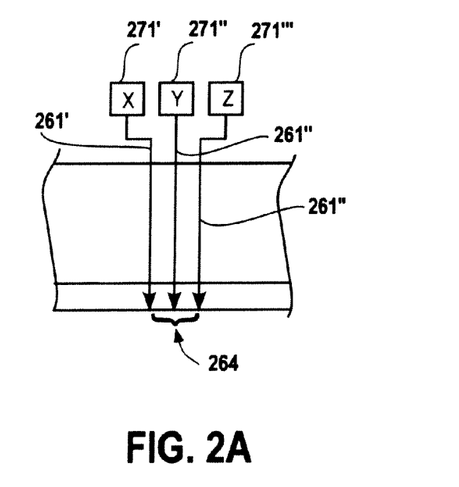
FIG. 2A shows a cross-sectional view of center feeds, in accordance with one embodiment of the present invention.
Figure 2B:
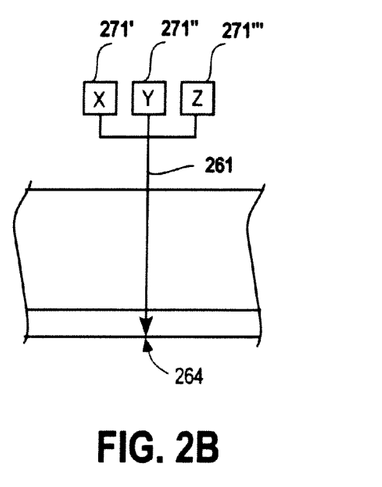
FIG. 2B shows a cross-sectional view of a center feed with multiple gas sources, in accordance with one embodiment of the present invention.
Figure 2C:
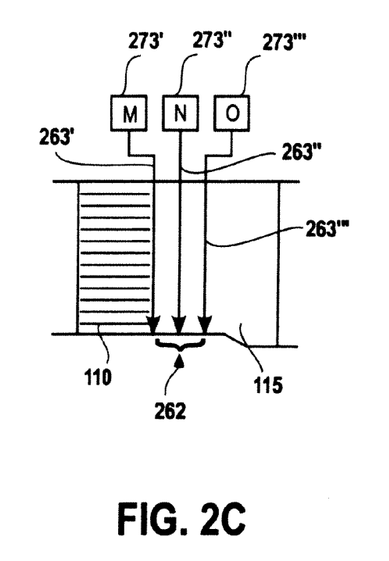
FIG. 2C shows a cross-sectional view of edge feeds, in accordance with one embodiment of the present invention.
Figure 2D:
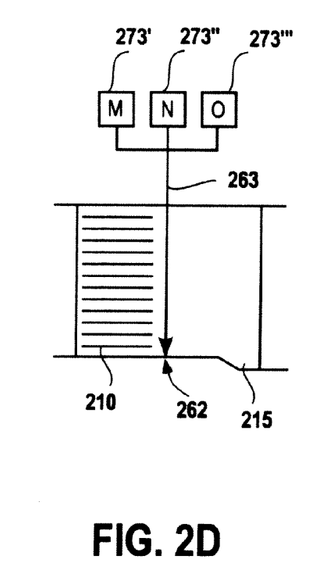
FIG. 2D shows a cross-sectional view of an edge feed with multiple gas sources, in accordance with one embodiment of the present invention.

FIG. 2 shows an embodiment of a bevel edge plasma processing chamber 200 for performing plasma etching near the bevel edge of the substrate. Chamber 200 has a substrate support 240 with a substrate 250 on top. In one embodiment, the substrate support 240 is an electrostatic chuck, which is powered by a RF (radio frequency) power source (not shown). In another embodiment, the substrate support 240 is a regular electrode. The substrate support 240 can be DC (direct current) or RF biased. Opposing the substrate support 230 is a gas plate 260 with a center gas feed 261. The feed point 264 of the center gas feed 261 is near above the center of the substrate. The center gas feed 261 is embedded in the gas plate 260 and located near the center of substrate 250. In one embodiment, there are a number of center gas feeds, such as gas feeds 261', 261", and 261", which are coupled to different gas sources, such as gas sources 271" (for gas X), 271" (for gas Y), and 271" (for gas Z), as shown in FIG. 2A. In another embodiment, different gas sources feed into a single center gas feed 261, as shown in FIG. 2B. The process chamber is also equipped with edge gas feeds 263, which are located near the bevel edge of substrate 250. In one embodiment, there are a number of edge gas feeds, such as gas feeds 263', 263", and 263", at the proximity of a location, which are coupled to different gas sources, such as gas sources 273" (for gas M), 273" (for gas N), and 273" (for gas O), as shown in FIG. 2C. In another embodiment, different gas sources feed into a single edge gas feed at 263 a particular edge location, as shown in FIG. 2D. More details of the edge gas feeds 263 will be provided below.

Figure 2E:
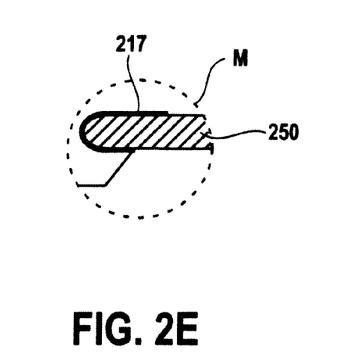
FIG. 2E shows a cross-sectional view of an enlarged region M with bevel edge of FIG. 2, in accordance with one embodiment of the present invention.

The substrate support can also be RF powered, biased, or grounded. During etching of substrate 250, chamber 200 can be RF powered to generate capacivtively coupled etch plasma or inductively coupled etch plasma. The substrate 250 has a bevel edge 217 that includes a top and a bottom surface of the edge of the substrate, as shown in region F of FIG. 2 and enlarged region M in FIG. 2E. In FIG. 2E, bevel edge 217 is highlighted as a bold solid line and curve.

Figure 2F:
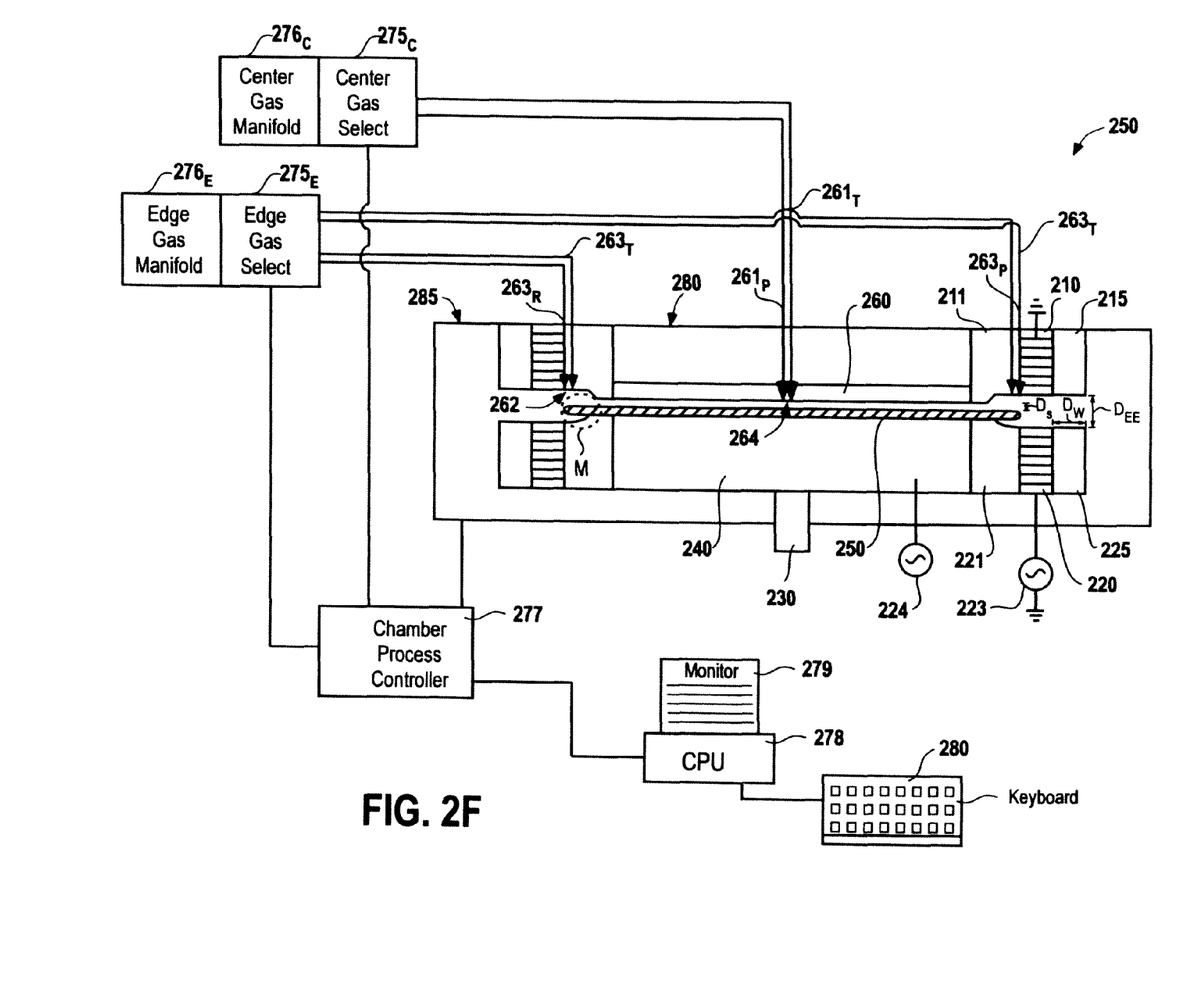
FIG. 2F shows a cross-sectional view of a plasma system configured to generate a bevel edge etching plasma, in accordance with another embodiment of the present invention.

FIG. 2F shows an embodiment of a bevel edge etching process chamber 250. The process chamber 250 has a center feed $261_P$ for process gas, and a center feed $261_T$ for tuning gas. Both center gas feeds $261_P$, $261_T$ are coupled to a center gas select $275_C$, which is coupled to a center gas manifold $276_C$. The center gas manifold $276_C$ is coupled to a number of gas tanks that supplied various process gases and tuning gas(es) (not shown). Alternatively, there could be more than one center gas feeds 261P for process gases and more one center gas feeds 261T for tuning gases, as described above in FIGS. 2A and 2C. The process chamber 250 also has a number of edge feeds $263_P$ for process gas, and a number of edge feeds $263_T$ for tuning gas. All edge gas feeds $261_P$, $261_T$ are coupled to an edge gas select $275_P$, which is coupled to an edge gas manifold $276_P$. The center gas manifold $276_P$ is coupled to a number of gas tanks that supplied various process gases and tuning gas(es) (not shown). The center gas select $275_C$ receives instructions from a chamber process controller 277 and chooses whether and which gas(es) goes into the center gas feeds, $261_P$, $261_T$. Similarly, the edge gas select $275_P$ receives instructions from a chamber process controller 277 and chooses whether and which gas(es) goes into the edge gas feeds, $263_P$, $263_T$. The chamber process controller 277 is also coupled to other parts of process chamber 250 to controller other process parameters, such as temperature, pressure and movement of the substrate support 240. In one embodiment, the chamber process controller 277 is coupled to a processor 278, which is coupled to a key board 280 and a monitor 279. Operators of the processing system 250 can enter instruction through the keyboard 280 and the instruction and process condition can be displayed in the monitor 279.

Figure 2G:
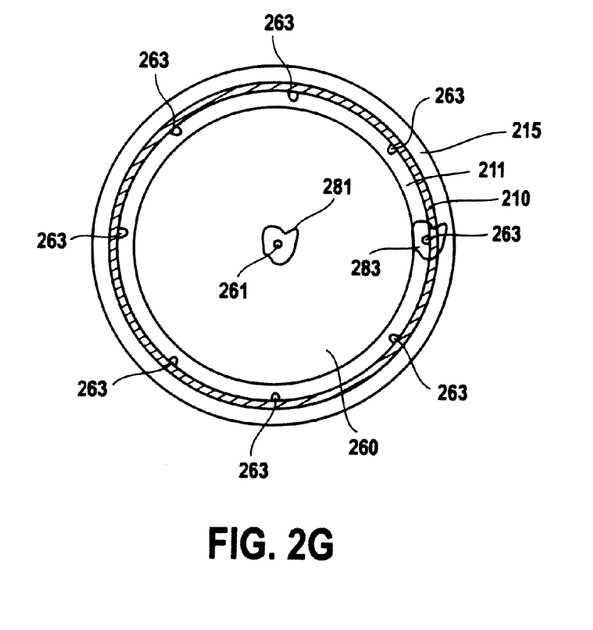
FIG. 2G shows a top view of a top chamber assembly of the plasma system of FIG. 2, in accordance with an embodiment of the present invention.

FIG. 2G shows an embodiment of a top view of the chamber top assembly 280 of FIG. 2. The top assembly 280 includes the chamber top wall 285 (not shown in FIG. 2G) and a gas delivery plate 260, a top dielectric ring 211, a top edge electrode, and a top insulating ring 215. The gas delivery plate 260, the top dielectric ring 211, the top edge electrode, and the top insulating ring 215 are coupled to the top chamber wall 285. The center gas feed 281 is embedded in the gas delivery plate 260. In the embodiment shown in FIG. 2G, there are 8 locations of edge gas feeds 263, which are disposed between the top dielectric ring 211 and the top edge electrode 210. The 8 locations are evenly distributed around the diameters of the top dielectric ring 211. The 8 locations are merely used as examples. Other number of locations, such as 4-56 locations, can be used too.

Figure 2H:
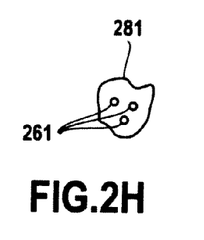
FIG. 2H shows an enlarged diagram of a region around a center gas feed, in accordance with an embodiment of the present invention.
Figure 2I:
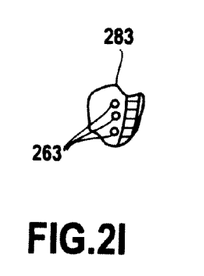
FIG. 2I shows an enlarged diagram of a region around an edge gas feed, in accordance with an embodiment of the present invention.

FIG. 2H shows an embodiment of an enlarged diagram of a region 281 around the center gas feed 261 of FIG. 2G. The embodiment shown in FIG. 2H illustrates that there could be more than one center gas feeds. Any reasonable and needed number of center gas feeds is allowed. FIG. 2I shows an embodiment of an enlarged diagram of a region 283 around the edge gas feed 263 of FIG. 2G. The embodiment shown in FIG. 2I illustrates that there could be more than one edge gas feeds at each edge location. Any reasonable and needed number of edge gas feeds at each edge location is allowed.

Figure 2J:
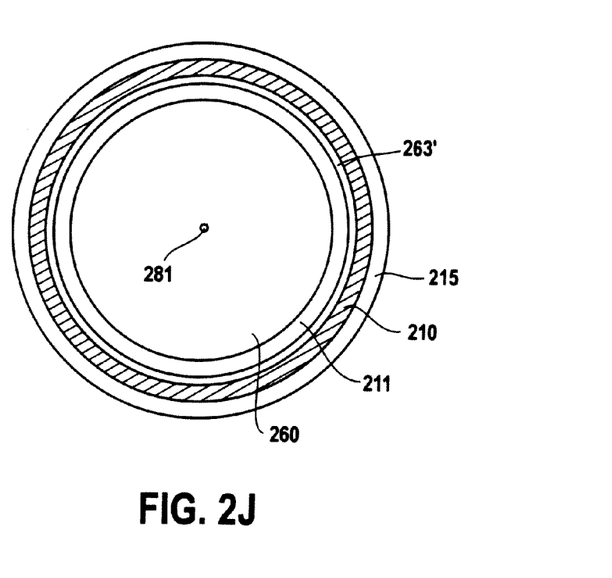
FIG. 2J shows a top view of a top chamber assembly of the plasma system of FIG. 2, in accordance with another embodiment of the present invention.

FIG. 2J shows another embodiment of edge gas feed 263 of FIG. 2. In this embodiment, edge gas feed 263' is a gas ring between the top dielectric ring 211 and the top edge electrode 210. Process gas(es) and/or tuning gas(es) can be delivered evenly to the process chamber through the gas ring 263'.

Surrounding the edge of substrate support 240, there is a bottom edge electrode 220, made of conductive materials, such as aluminum (Al). Between the substrate support 240 and the bottom edge electrode 220, there is a bottom dielectric ring 221 electrically separating the substrate support 240 and the bottom edge electrode 220. In one embodiment, substrate 250 is not in contact with the bottom edge electrode 220. Beyond the bottom edge electrode 220, there is another bottom insulating ring 225, which extends the surface of the bottom edge electrode 220 facing substrate 250.

Surrounding the gas plate 260, there is a top edge electrode 210, made of conductive materials, such as aluminum (Al). The top edge electrode 210 is electrically insulated from the gas plate 260 by a top dielectric ring 211. As mentioned above, the edge gas feed(s) 263 provides process gas(s) to the bevel edge 217 of substrate 250. In one embodiment, the edge gas feeds 263 provide process gas(es) to feeding points 262 facing the bevel edge 217 of substrate 260 and are between the top edge electrode 210 and the top dielectric ring 211. Beyond the top edge electrode 210, there is top insulating ring 215, which extends the surface of the top edge electrode 210 facing substrate 250.

In one embodiment, the bottom edge electrode 220 is coupled to an RF power source 223 and the top edge electrode 210 is grounded. During a substrate bevel edge treatment process, the RF power source 223 supplies RF power at a frequency between about 2 MHz to about 60 MHz and a power between about 100 watts to about 2000 watts to generate a treatment plasma. During bevel edge treatment the substrate support 240 and the gas delivery plate 260 are kept electrically floating. In another embodiment, the bottom electrode 240 is coupled to an RF power source 224. During a substrate bevel edge treatment process, the RF power source 224 supplies RF power at a frequency between about 2 MHz to about 60 MHz and a power between about 100 watts to about 2000 watts to generate a treatment plasma. During bevel edge treatment the gas delivery plate 3=260 is kept electrically floating, and both the bottom edge electrode 220 and the top edge electrode 210 are grounded.

The two embodiments of hardware configurations described above are merely examples, other configurations of bevel edge reactors can also be used. For details of other types of bevel edge reactors, see U.S. patent application Ser. No. 11/758,576 filed on Jun. 5, 2007, entitled "Edge Electrodes with Variable Power," U.S. patent application Ser. No. 11/758,584 filed on Jun. 5, 2007, entitled "Edge Electrodes with Dielectric Covers," U.S. patent application Ser. No. 11/440,561 filed on May 24, 2006, entitled "Apparatus and Methods to Remove Films on Bevel Edge and Backside of Wafer," U.S. patent application Ser. No. 11/355,458 filed on Feb. 15, 2006, entitled "Plasma Processing Reactor with Multiple Capacitive and Inductive Power Sources," and U.S. patent application Ser. No. 11/363,703 filed on Feb. 27, 2006, entitled "Integrated Capacitive and Inductive Power Sources for a Plasma Etching Chamber." The disclosure of each of the above-identified related applications is incorporated herein by reference.

In one embodiment, the space between the top edge electrode 210 and the bottom edge electrode 220, $D_{EE}$, is less than 1.5 cm to ensure the plasma is confined. A $D_{EE}$ of less than 1.5 cm allows the ratio between the width ($D_W$) and gap ($D_{EE}$) of the opening near substrate edge to be less than 4:1, which ensures plasma confinement. $D_W$ is the width of the opening near the substrate edge. In one embodiment, $D_W$ is the width of the bottom insulating ring 225 or the width of the top insulating ring 215. The chamber pressure is kept between about 20 mTorr to about 100 Torr, and preferably between about 100 mTorr to about 2 Torr, during the bevel edge etching process. The spacing between the gas distribution plate 260 and substrate 250, $D_S$, is less than 0.6 mm to ensure no plasma is formed between the top electrode 260 and the substrate 250 during the bevel edge etching process.

The embodiment of plasma chamber 200 shown in FIG. 2 is merely an example. Other embodiments of plasma chamber for bevel edge etching are also possible. In another embodiment, the RF power supply can be coupled to the top edge electrode 210, while the bottom edge electrode 220 is grounded to generate the capacitively coupled etching plasma. Alternatively, either the top edge electrode 210 or the bottom edge electrode 220 can be replaced with an inductive coil buried in a dielectric material. In this embodiment, the inductive coil is coupled to a RF power source and the opposing edge electrode is grounded. The RF power source supplies power to generate an inductively coupled etching plasma to treat the bevel edge 217. For further description of the bevel edge plasma etching chamber see U.S. patent application Ser. No. (11/3440,561) filed on May 24, 2006, entitled "Apparatus and Methods to Remove Films on the Bevel Edge and Backside of Wafer." The disclosure of the above-identified related applications is incorporated herein by reference.

Various experiments have been conducted to study the effects of location of gas feed(s), total gas flow, tuning gas type, tuning gas flow, the gap distance between the gas plate 260 and substrate 250 on the etch rate profiles at the bevel edge. An exemplary reference process for etching dielectric film is used for these studies. The process (etching) gases include $NF_3$ and $CO_2$. The film etched is silicon oxide film ($SiO_2$) deposited from tetra-ethyl-ortho-silicate (TEOS). The tuning gas, which is not a reactive gas, used in the study includes nitrogen ($N_2$), argon (Ar), and helium (He). However, in addition to the above-mentioned tuning gas, other types of non-reactive gas, such as other inert gases, can also be used as tuning gas.

The exemplary reference process with 10 sccm $NF_3$ and 200 $CO_2$ fed from the center gas feed 261 similar to the center gas feed shown in FIG. 2. The pressure is about 1500 mTorr. The gap distance between the gas delivery plate 260 and surface of substrate 250 is about 0.4 mm.

Figure 3A:
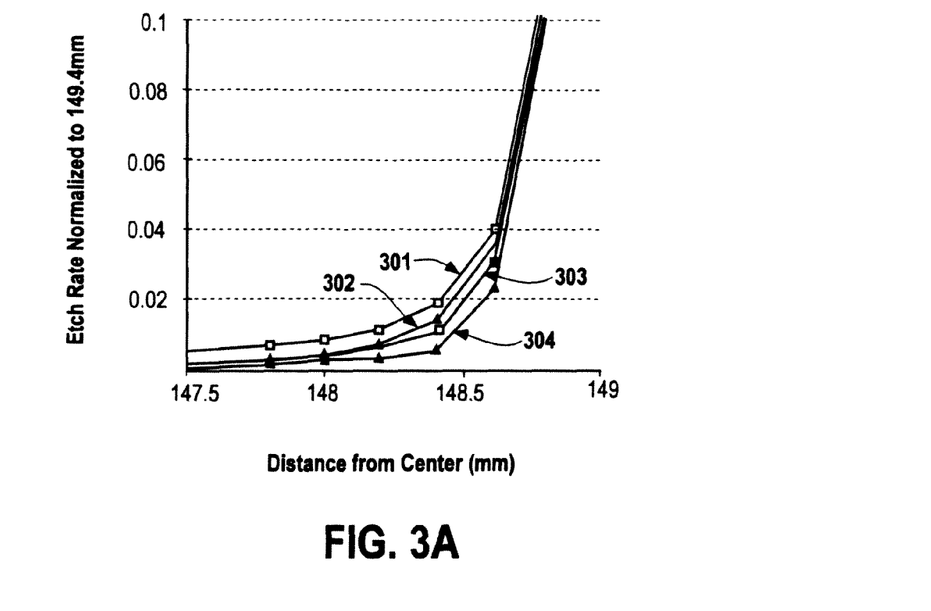
FIG. 3A shows bevel etching profiles of 4 different etching processes, in accordance with one embodiment of the present invention.

FIG. 3A shows a plot of normalized etch rates on different locations on the substrate surface near bevel edge. The normalized etch rates are plotted with the distance from the center of the substrate. The etch rates are normalized to the etch rate at 149.4 mm from the center of the substrate. The substrate has a diameter of 300 mm and a radius of 150 mm. There are four curves in FIG. 3A. Curve 301 shows the results of the reference process with 10 sccm $NF_3$ and 200 sccm $CO_2$ fed from center gas feed(s). Data for curve 302 are generated using a process similar to the process of curve 301, but with the $CO_2$ gas flow increased from 200 sccm to 500 sccm. Comparing curves 301 and 302, the results show that increasing the $CO_2$ gas flow pushes the etch rate curve toward the bevel edge. 500 sccm $CO_2$ gas extends the area with zero etch rate to about 2.5 mm from the edge of substrate. In contrast, when the $CO_2$ gas is at 200 sccm, the etch rate is not zero even when the distance is at about 2.5 mm from the edge of substrate.

Curve 303 shows etching results of a process with 10 sccm $NF_3$ and 200 sccm $CO_2$ fed from center process gas feed, and with an additional 300 sccm $N_2$ tuning gas (non-reactive gas) fed from the center gas feed. Curve 304 shows etching results of a process with 10 sccm $NF_3$ and 200 sccm $CO_2$ fed from center process gas feed, and with an additional 500 sccm N2 tuning gas (non-reactive gas) fed from the center gas feed.

The results show that both the 300 sccm $N_2$ tuning gas feed and 500 sccm N2 tuning gas from the center gas feed help to push the bevel edge etching rate profile further out towards the substrate edge, in comparison to the standard process of curve 301. However, none of the processes of curves 301, 302, 303, and 304 generate a bevel edge etching profile that has zero etch rate at about 2 mm (or at 148 mm location in the FIG. 3A plot) from the edge of substrate.

Figure 3B:
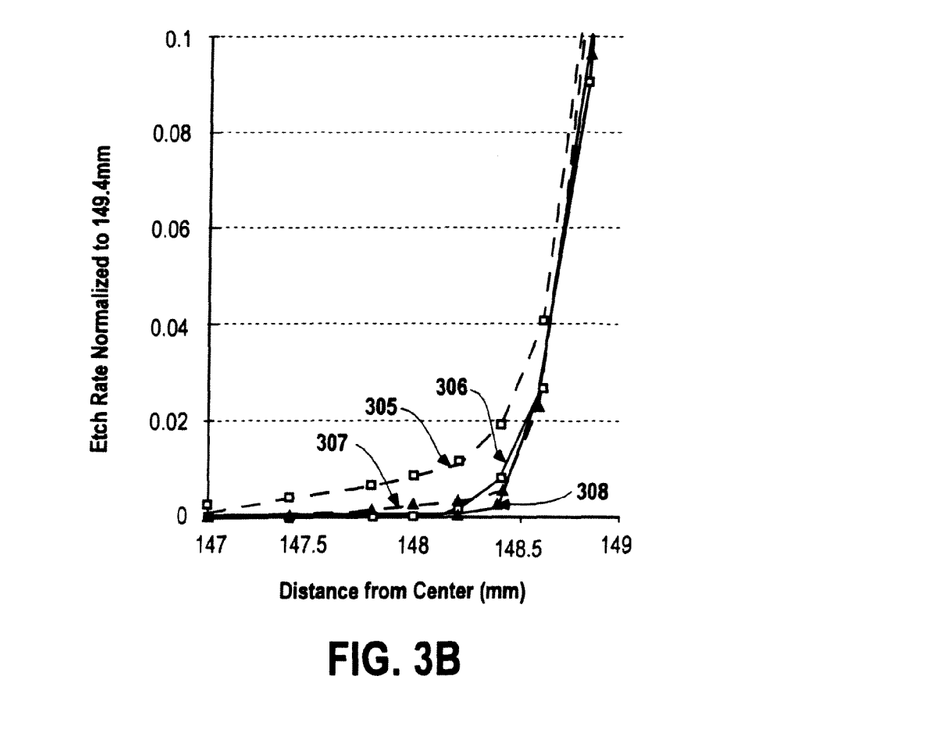
FIG. 3B shows bevel etching profiles of 4 different etching processes, in accordance with another embodiment of the present invention.

FIG. 3B shows a plot of normalized etch rates of 4 different processes on the substrate surface. Curve 305 shows the reference process with 10 sccm $NF_3$ and 200 $CO_2$ fed from the center gas feed 261. Curve 305 is identical to curve 301 of FIG. 3A. Data for curve 306 are generated using a process similar to the process of curve 305, with the exception that both the $NF_3$ gas and $CO_2$ gas are fed from edge gas feed(s), such as edge gas feed 263. Comparing curves 305 and 306, the results show that feeding process gases $NF_3$ and $CO_2$ from edge gas feed(s) pushes the etch rate curve toward the bevel edge. Processing gas fed from edge gas feeds extends the area with zero etch rate to about 2 mm from the edge of substrate. In contrast, when the processing gas is fed from the center gas feed, the etch rate is not zero even when the distance is 3 mm from the edge of substrate.

Curve 307 uses a process similar with curve 305 (reference process) with process gases fed from center gas feed(s), and with an additional 500 sccm $N_2$ tuning gas (non-reactive gas) fed from center gas feed. Curve 308 a process similar with curve 306, with process gases fed from edge gas feed(s), and with a 500 sccm $N_2$ tuning gas (non-reactive gas) fed from center gas feed. The results show that the 500 sccm $N_2$ tuning gas feed from the center gas feed help to push the edge of zero etch rate from 2 mm of curve 306 (process gases fed from edge) to 1.8 mm of curve 308 (process gases fed from edge). As shown in FIG. 3B, the 500 sccm $N_2$ tuning gas feed from the center gas feed helps to push the edge of zero etch rate from greater than 3 mm for curve 305 (process gases fed from center) to 2.6 mm for curve 307 (process gases fed from center). The results favor feeding process gases from the edge, in comparison to feeding process gases from the center. In addition, the results also show that 500 sccm of $N_2$ turning gas from center gas feed(s) also can push the boundary of zero etch rate further towards the edge of substrate. Both processes with process gases fed from substrate edge (curves 306 and 308), either with 500 $N_2$ tuning gas (curve 308) or without $N_2$ tuning gas (curve 306), generate bevel edge etching profiles that have zero etch rate at about 2 mm or less than 2 mm from the edge of substrate. Feeding process gases near the bevel edge is crucial in pushing the boundary to zero etch rate to 2 mm from the edge of substrate.

Experiments with varying amount of $N_2$ tuning gas, 300 sccm, 500 sccm, and 750 sccm, fed from center gas feed(s) show that etch profile at bevel edge for $N_2$ tuning gas at 500 sccm is slightly better than results for 300 sccm and 750 sccm N2 tuning gas in terms of pushing the etch profile outward toward the edge. However, the results for 300 sccm and 750 sccm $N_2$ tuning gas processes are not too different from those of 500 sccm $N_2$ tuning gas process.

Experiments with higher $CO_2$ flow (300 sccm vs. 200 sccm) fed from center feed shows that increased $CO_2$ flow helps push the etch rate profile outward towards the edge of substrate.

In addition, comparing the results of the reference process to a process with 20 sccm $NF_3$ and 400 sccm $CO_2$ (2× total flow) fed from center gas feed shows that increased total flow help to push the etch rate profile outward towards the edge of the substrate. For the 2× total flow process, the edge of zero etch rate is at about 2.2 mm from the edge of substrate. In contrast, the edge of zero etch rate for the reference process is more than 3 mm from the edge of substrate.

Figure 3C:
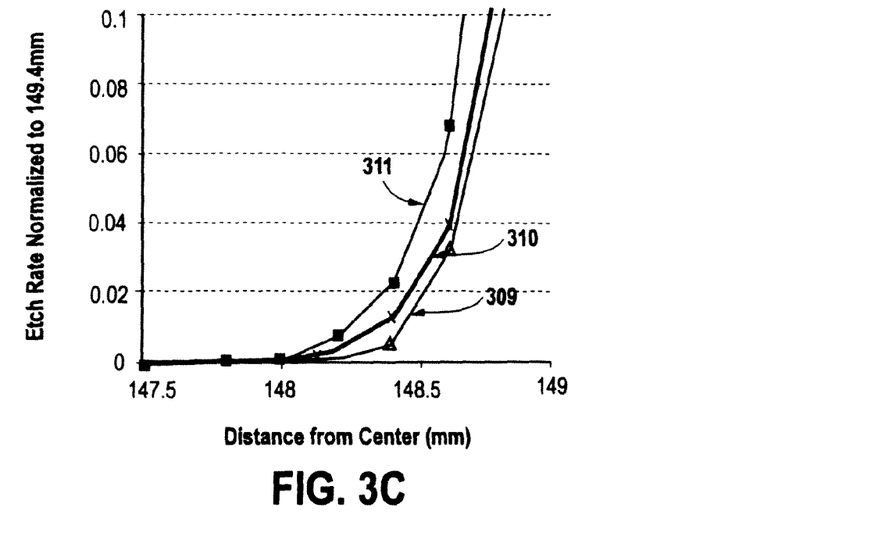
FIG. 3C shows bevel etching profiles of 3 different etching processes, in accordance with one embodiment of the present invention.

FIG. 3C compares the results of 3 different processes. Curve 309 is generated using the process with 10 sccm $NF_3$ and 200 sccm $CO_2$ at the substrate edge, and with an additional 750 sccm $N_2$ tuning gas fed from center. The process is run at normal gap space of 0.4 mm. The results of curve 309 is very close to curve 308 of FIG. 3B. As mentioned above, the results of using 750 sccm $N_2$ tuning gas and 500 sccm $N_2$ gas at center feed(s) are quite close. Curve 310 uses the same process as curve 309, with the exception of using a gap space of 0.35 mm between gas delivery plate and the substrate. Curve 311 uses the same process as curve 309, with the exception of using a gap space of 0.45 mm between gas delivery plate and the substrate. The results show that a gap space of 0.4 mm yields the best results.

Figure 3D:
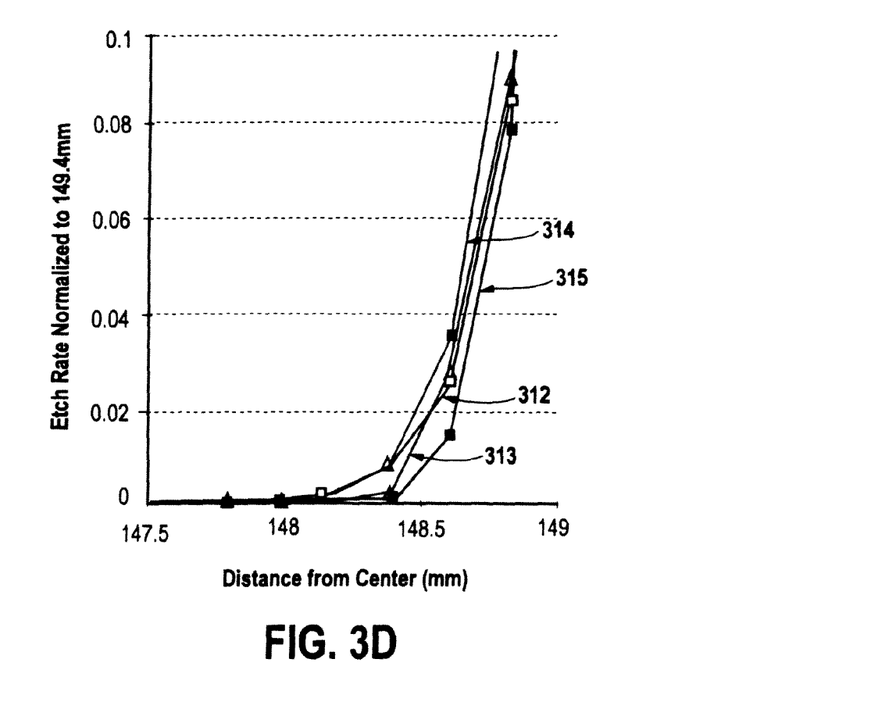
FIG. 3D shows bevel etching profiles of 4 different etching processes, in accordance with another embodiment of the present invention.

FIG. 3D compares the results of 4 different processes. Curve 312 is generated using a process with 10 sccm $NF_3$ and 200 sccm $CO_2$ fed at the substrate edge. Curve 313 is generated using the same process as curve 309, but with an additional 500 sccm $N_2$ tuning gas fed at the center gas feed. The results show similar conclusion, as the previously mentioned, that adding 500 sccm $N_2$ tuning gas helps push the edge of zero etch rate further outward (comparing curves 306 and 308 of FIG. 3B). Curve 314 uses the same process as curve 313, but with a different tuning gas Ar at the same flow rate of 500 sccm. The effect of adding 500 sccm Ar tuning gas is worse than adding 500 sccm $N_2$ tuning gas (curve 313) and is even worse than not adding any tuning gas at all (curve 312). Curve 315 uses a process with 10 sccm $NF_3$ and 200 sccm $CO_2$ at the substrate edge (similar to curves 312, 313, and 314), but the tuning gas fed at center gas feed is a combination of 200 sccm $N_2$ with 500 sccm helium (He). The results show that the combination of 200 sccm $N_2$ with 500 sccm He yields best results.

The results above show that there having center and edge gas feeds provide additional process knobs to use for selecting a most suitable bevel edge etching processes. In addition, adding a tuning gas, such as $N_2$, Ar, or He, or a mixture of multiple tuning gases can change the etching profile at the bevel edge of substrate. Further total gas flow and gap distance between the gas delivery plate and substrate surface can also affects etching profiles. In addition, as shown in the results and description above, process gas type can have an impact on the etching profiles and interacts with the tuning gas. The various factors mentioned above either change the plasma composition, or changes characteristics at the bevel edge. The changes affect the bevel edge etching profiles.

Figure 4:
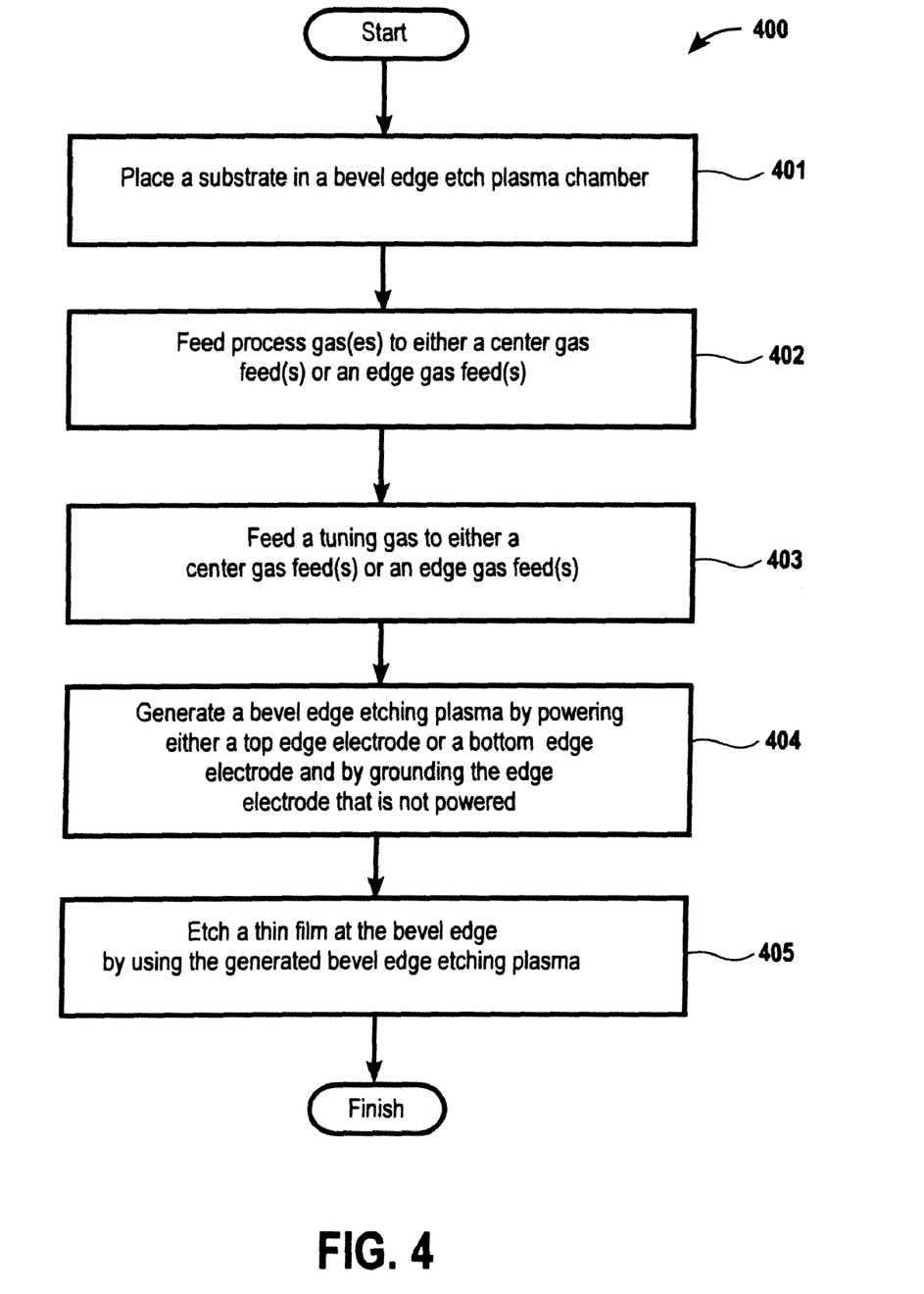
FIG. 4 shows a process flow of generating a bevel edge etching plasma, in accordance with one embodiment of the present invention.

FIG. 4 shows an exemplary process flow 400 of generating a bevel edge etching plasma by feeding process gas from edge gas feed(s) and feeding a tuning gas from center gas feed(s) to a process chamber. At step 401, a substrate is place on a substrate support in a bevel edge etch plasma chamber. At step 402, process gas(es) is fed to either an edge gas feed(s) or a center gas feed(s) in the processing chamber. At an optional process step 403, a tuning gas(es) is fed to either an edge gas feed(s) or a center gas feed(s) in the processing chamber. At step 404, an etching plasma is generated near the bevel edge of the substrate by powering either a top edge electrode or a bottom edge electrode. If the top edge electrode is powered, the bottom edge electrode is grounded. If the bottom edge electrode is powered, the top edge electrode is grounded. At step 405, the thin film at the bevel edge is removed by the bevel edge etching plasma. The plasma etching chamber is configured to generate the bevel edge etching plasma that etches thin film at the bevel edge with edge exclusion zone less than about 2 mm from the edge of substrate. In one embodiment, the edge exclusion zone is less than about 1 mm from the edge of substrate. In another embodiment, the edge exclusion zone is less than about 0.5 mm from the edge of substrate.

The exemplary processes discussed above are for TEOS $SiO_2$ etching. However, the concept of the present invention can be for etching any types of films, such as other dielectric films, metal films, semiconductor films, and barrier films, at bevel edges. Tuning gas, location of gas feed(s), gap distance, total gas flow, type of processing gas can all have an impact on the etching profiles at the bevel edge.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of etching a film on a bevel edge of a substrate in a plasma etching chamber, comprising:
   providing the substrate on a substrate support in the plasma etching chamber, the plasma etching chamber having a top edge electrode and a bottom edge electrode disposed to surround the substrate support;
   positioning a gas delivery plate in the plasma processing chamber at a distance of less than about 0.6 mm from the substrate support;
   flowing an etching process gas through a plurality of edge gas feeds disposed along a periphery of the gas delivery plate, the periphery of the gas deliver plate being oriented above the substrate support and the bevel edge of the substrate, the flowing further directed to a space between the top edge electrode and bottom edge electrode;
   flowing a tuning gas through a center gas feed of the gas delivery plate, the tuning gas directed over a center region of the substrate so as to flow way from the center region and toward the bevel edge of the substrate and mix with the etching process gas; and
   applying RF power to one of the top or bottom edge electrodes, the applied power acting to strike a plasma to etch the film of the bevel edge of the substrate;
   wherein the flown etching process gas through the plurality of edge gas feeds is defined from an $NF_3$ gas and a $CO_2$ gas, and the tuning gas is N2 flown from the center gas feed.

2. The method of claim 1, further comprising,
   arranging the a distance between the top and bottom edge electrodes to be less than about 1.5 cm.

3. The method of claim 1, wherein the tuning gas is provided with flow rate of between about 300 sccm and about 750 sccm.

4. The method of claim 1, wherein the tuning gas is provided as a mixture of two or more of $N_2$, Ar, and He, setting the mixture provides for tuning an etching profile at the bevel edge of substrate.

5. The method of claim 1, wherein the film is one of a dielectric film, or a metal film, or a photoresist film, or a semiconductor film, or a combination thereof.

6. A method of etching a film on a bevel edge of a substrate in a plasma etching chamber, comprising:
   providing the substrate on a substrate support in the plasma etching chamber, the plasma etching chamber having a top edge electrode and a bottom edge electrode disposed to surround the substrate support;
   positioning a gas delivery plate in the plasma processing chamber at a distance of less than about 0.6 mm from the substrate support;
   flowing an etching process gas through a plurality of edge gas feeds disposed along a periphery of the gas delivery plate, the periphery of the gas deliver plate being oriented above the substrate support and the bevel edge of the substrate, the flowing further directed to a space between the top edge electrode and bottom edge electrode;
   flowing a tuning gas through a center gas feed of the gas delivery plate, the tuning gas directed over a center region of the substrate so as to flow way from the center region and toward the bevel edge of the substrate and mix with the etching process gas; and
   applying RF power to one of the top or bottom edge electrodes, the applied power acting to strike a plasma to etch the film of the bevel edge of the substrate;
   wherein the film is a dielectric material and the etching process gas includes $NF_3$ and $CO_2$, and the tuning gas includes at least one of nitrogen ($N_2$), argon (Ar), and helium (He).

7. The method of claim 6, wherein the film is one of a dielectric film, or a metal film, or a photoresist film, or a semiconductor film, or a combination thereof.

8. A method of etching a film on a bevel edge of a substrate in a plasma etching chamber, comprising:
   providing the substrate on a substrate support in the plasma etching chamber, the plasma etching chamber having a top edge electrode and a bottom edge electrode disposed to surround the substrate support;
   positioning a gas delivery plate in the plasma processing chamber at a distance of less than about 0.6 mm from the substrate support;
   flowing an etching process gas through a plurality of edge gas feeds disposed along a periphery of the gas delivery plate, the periphery of the gas deliver plate being oriented above the substrate support and the bevel edge of the substrate, the flowing further directed to a space between the top edge electrode and bottom edge electrode;
   flowing a tuning gas through a center gas feed of the gas delivery plate, the tuning gas directed over a center region of the substrate so as to flow way from the center region and toward the bevel edge of the substrate and mix with the etching process gas; and
   applying RF power to one of the top or bottom edge electrodes, the applied power acting to strike a plasma to etch the film of the bevel edge of the substrate, wherein, the tuning gas provided from the center feed includes $NF_3$ and $CO_2$, and adjusting a flow rate of $CO_2$.

9. The method of claim 8, further including N2 as an additional non-reactive gas supplied from the center feed.

10. The method of claim 8, wherein the film is one of a dielectric film, or a metal film, or a photoresist film, or a semiconductor film, or a combination thereof.

11. The method of claim 8, wherein adjusting the flow rate of $CO_2$ up increases etch rate in the bevel edge closer to an edge of the substrate.

12. The method of claim 11, wherein the flow rate of $CO_2$ is adjusted between 200 sccm to 500 sccm.

* * * * *